(12) United States Patent
Rietsch et al.

(10) Patent No.: US 10,893,615 B2
(45) Date of Patent: Jan. 12, 2021

(54) PRINTED CIRCUIT BOARD COMPOSITE AND METHOD FOR PRODUCING SAME

(71) Applicant: CPT ZWEI GMBH, Hannover (DE)

(72) Inventors: Juergen Rietsch, Wendelstein (DE); Andreas Plach, Forchheim (DE); Andreas Albert, Hoechstadt/Aisch (DE); Mathias Strecker, Crailsheim (DE); Hassene Bel Haj Said, Nuremberg (DE); Johannes Bock, Hersbruck (DE); Thengis Greifenstein, Nuremberg (DE)

(73) Assignee: CPT Zwei GmbH, Hannover (DE)

(*) Notice: Subject to any disclaimer, the term of this patent is extended or adjusted under 35 U.S.C. 154(b) by 0 days.

(21) Appl. No.: 16/468,820

(22) PCT Filed: Dec. 8, 2017

(86) PCT No.: PCT/EP2017/082109
§ 371 (c)(1),
(2) Date: Jun. 12, 2019

(87) PCT Pub. No.: WO2018/108758
PCT Pub. Date: Jun. 21, 2018

(65) Prior Publication Data
US 2020/0077525 A1  Mar. 5, 2020

(30) Foreign Application Priority Data
Dec. 12, 2016 (DE) ........................ 10 2016 224 653

(51) Int. Cl.
*H05K 3/36* (2006.01)

(52) U.S. Cl.
CPC ....... *H05K 3/366* (2013.01); *H05K 2201/048* (2013.01); *H05K 2201/09827* (2013.01); *H05K 2201/10151* (2013.01)

(58) Field of Classification Search
CPC .............................. H01R 12/00; H01R 12/52
USPC .................................... 439/65; 361/803, 784
See application file for complete search history.

(56) References Cited

U.S. PATENT DOCUMENTS

| | | | | |
|---|---|---|---|---|
| 2,958,013 | A * | 10/1960 | Ansley | H05K 1/14 361/736 |
| 3,522,485 | A * | 8/1970 | Metrick | H05K 1/141 361/758 |
| 4,513,064 | A | 4/1985 | Marcus | |
| 6,804,120 | B2 * | 10/2004 | Clark | H05K 3/366 361/736 |

(Continued)

FOREIGN PATENT DOCUMENTS

| | | |
|---|---|---|
| DE | 2441209 A1 | 3/1976 |
| DE | 3919273 A1 | 12/1990 |

(Continued)

*Primary Examiner* — Hien D Vu
(74) *Attorney, Agent, or Firm* — Laurence A. Greenberg; Werner H. Sterner; Ralph E. Locher

(57) ABSTRACT

A printed circuit board composite and a method for producing same. In the method for producing the printed circuit board composite, a first printed circuit board, in particular a sensor carrier printed circuit board, is connected in a form-fitting manner to a second printed circuit board, in particular a supporting printed circuit board. There is also described a printed circuit board composite.

13 Claims, 7 Drawing Sheets

(56) References Cited

U.S. PATENT DOCUMENTS

| | | | | |
|---|---|---|---|---|
| 7,435,095 B1* | 10/2008 | Yi | ............... | H01R 12/52 |
| | | | | 439/61 |
| 7,864,544 B2* | 1/2011 | Smith | ............... | H05K 3/366 |
| | | | | 361/770 |
| 8,328,571 B2* | 12/2012 | Mulfinger | ............... | G06F 1/185 |
| | | | | 439/260 |
| 9,271,420 B1* | 2/2016 | Hsiao | ............... | H05K 7/1432 |
| 9,531,099 B2* | 12/2016 | Convert | ............... | H01R 13/28 |
| 2002/0071259 A1 | 6/2002 | Roos | | |
| 2013/0003331 A1 | 1/2013 | Zhou et al. | | |
| 2013/0078825 A1* | 3/2013 | Wain | ............... | H05K 3/366 |
| | | | | 439/64 |

FOREIGN PATENT DOCUMENTS

| | | |
|---|---|---|
| DE | 4244626 A1 | 6/1994 |
| DE | 102012213304 A1 | 1/2014 |
| JP | 2008071848 A | 3/2008 |
| JP | 2009152331 A | 7/2009 |

* cited by examiner

PRINTED CIRCUIT BOARD COMPOSITE AND METHOD FOR PRODUCING SAME

BACKGROUND OF THE INVENTION

Field of the Invention

The invention relates to a printed circuit board composite and to a method for producing same.

Printed circuit boards are generally known from the prior art.

SUMMARY OF THE INVENTION

The object on which the invention is based is to specify a method for producing a printed circuit board composite that is improved in relation to the prior art and a printed circuit board composite that is improved in relation to the prior art.

The object is achieved according to the invention by a method for producing a printed circuit board composite as claimed and by a printed circuit board composite as claimed.

Advantageous refinements of the invention are the subject matter of the dependent claims.

In a method according to the invention for producing a printed circuit board composite, a first printed circuit board, in particular a sensor carrier printed circuit board, is connected in a form-fitting manner to a second printed circuit board, in particular a supporting printed circuit board. As a result, the first printed circuit board is supported by the second printed circuit board particularly during a process of connecting the first printed circuit board and the second printed circuit board to a third printed circuit board formed in particular as a main printed circuit board. This connection process comprises, for example, the arrangement of the first and second printed circuit board on the third printed circuit board and the regional or complete overmolding of at least the first printed circuit board with a plastic, in particular with a thermoset plastic, in a plastic overmolding process in which at least the first and expediently also the second printed circuit board are arranged in a plastic overmolding mold and are overmolded with plastic.

In one advantageous embodiment, the two printed circuit boards each have a groove, wherein the two printed circuit boards are connected to one another in such a way that groove bottoms of the two grooves contact one another. The two printed circuit boards are thus joined together in such a way that their grooves slot into one another, with the result that groove side walls of the first printed circuit board bear against flat sides of the second printed circuit board, and groove side walls of the second printed circuit board bear against flat sides of the first printed circuit board. This connection is also referred to as a two-groove connection. The respective printed circuit board is thus expediently clamped in the groove of the respective other printed circuit board, resulting not only in a form-fitting connection but also a force-fitting connection.

The two printed circuit boards are expediently connected so as to be oriented with respect to one another in such a way that surface normals of the two printed circuit boards are oriented at right angles to one another. Here, length extents of the two printed circuit boards advantageously extend parallel to one another. The length extents of the two printed circuit boards are expediently substantially identical and the two printed circuit boards bear against one another substantially over their length extent region, or the second printed circuit board bears against the first printed circuit board over a substantial length extent region of the first printed circuit board, in particular over more than half of the length extent region of the first printed circuit board. The first and second printed circuit board are expediently formed in such a way and are connected to one another in such a way that the first printed circuit board is supported over its entire length extent region or over a substantial part thereof, in particular over more than half of the length extent region, by the second printed circuit board.

In one advantageous embodiment, the two printed circuit boards are connected to one another in such a way that a component, in particular a sensor, arranged on the first printed circuit board is supported in its position by the second printed circuit board. For this purpose, after connection of the two printed circuit boards, the second printed circuit board expediently bears against the component, in particular against at least one circumferential side of the component or against a plurality of circumferential sides. The second printed circuit board is latched on the sensor, for example. In this way, the component on the first printed circuit board is supported by the second printed circuit board and held in position, for example during the plastic overmolding process. It is possible by correspondingly shaping the second printed circuit board to provide a support for various component structure designs, for example sensor structure designs. This support of the component, for example the sensor, particularly ensures improved positioning accuracy.

There can advantageously be provision that the two printed circuit boards are latched with one another. For example, the two printed circuit boards have corresponding latching hooks or other corresponding latching elements. For example, one of the printed circuit boards has one or more latching lugs, and the other printed circuit board has a latching opening corresponding to the respective latching lug. This avoids the two printed circuit boards drifting apart, in particular during the plastic overmolding process.

At least the first printed circuit board is expediently connected to the third printed circuit board, in particular the main printed circuit board. A so-called sensor dome is thus formed, for example, if the component on the first printed circuit board is formed as a sensor. Here, the first printed circuit board is expediently perpendicular to the third printed circuit board.

In one advantageous embodiment, at least one positioning formation of the first printed circuit board is introduced into a corresponding cutout in the third printed circuit board. Consequently, a position of the first printed circuit board relative to the third printed circuit board, in particular relative to soldering points on the third printed circuit board, is secured.

There can be provision that the first printed circuit board and the third printed circuit board are soldered to one another. For this purpose, for example, the at least one positioning formation is metal-coated at least in certain regions, expediently all around. The soldering expediently takes place without electrical contact, that is to say no current conduction is subsequently provided by way of this soldering. This is also referred to as the principle of blind contact soldering.

At least the first printed circuit board is expediently overmolded at least in certain regions with a plastic, in particular with a thermoset plastic. With preference, the second printed circuit board is also overmolded with the plastic at least in certain regions and/or at least a region of the third printed circuit board is overmolded with the plastic.

An integrally bonded connection of the first printed circuit board with the second and/or third printed circuit board is thereby achieved.

Further advantageous embodiments of the method for producing the printed circuit board composite are described below. The printed circuit board composite produced by means of the method described can be used, for example, in a vehicle, for example in a transmission control device. Here, the first printed circuit board is expediently formed as a sensor carrier printed circuit board which bears the sensor as component, and the third printed circuit board is formed as main printed circuit board. A joining process for connecting the first and second printed circuit board expediently occurs, as already described, by means of the so-called two-groove plug connection. The second printed circuit board formed as supporting printed circuit board has the function of supporting the first printed circuit board, which is expediently formed as sensor carrier printed circuit board, in a subsequent mounting process, soldering process and/or plastic overmolding process, in particular thermoset overmolding process.

The first printed circuit board, which is populated with one or more components formed in each case as a sensor, for example, and which is expediently formed as a sensor carrier printed circuit board, is expediently held in position with respect to the third printed circuit board via one or more positioning formations, also referred to as positioning pins. It is expediently held in position in the region of soldering points in the third printed circuit board. The positioning can occur by clamping in corresponding cutouts, for example receiving holes in the third printed circuit board. In other embodiments, one or more positioning formations can be provided on the third printed circuit board, and a respective corresponding cutout can be provided in the first printed circuit board.

Furthermore, the respective positioning formation can be metal-coated all around and be soldered in without electrical contact (principle of blind contact soldering). The first printed circuit board, in particular sensor carrier printed circuit board, preferably after being populated, is expediently received in a corresponding mold in a plastic overmolding process, in particular thermoset overmolding process, and received in the x direction and y direction, that is to say in the width extent direction and thickness extent direction. The Z direction, that is to say the length extent direction, remains free in order to obtain no compression forces on the third printed circuit board, which is formed for example as main printed circuit board, and the soldering points.

A further shaping of the second printed circuit board formed as supporting printed circuit board means that the component, for example the sensor, on the first printed circuit board can be supported in order to obtain improved positioning accuracy of the component, in particular the sensor. Here, a support for different component structure designs, in particular sensor structure designs, is possible. The component, in particular the sensor, can also be held more accurately in position in the plastic overmolding process from above and below by a cutout in the second printed circuit board formed as supporting printed circuit board.

In order to avoid the first and second printed circuit board drifting apart particularly in the upper region, there can be provided latching arrangements, for example latching hooks, which are inserted into one another in the process of joining together the first and second printed circuit board and thus allow even more stability for example in the sensor dome design already mentioned above.

After joining together the three printed circuit boards, the sensor dome design can be overmolded with plastic, in particular thermoset. Here, particularly the first printed circuit board is overmolded at least in certain regions. By virtue of tailored support geometries, the position particularly of the first printed circuit board with the component can be held more accurately in the overmolding mold during the overmolding operation.

A printed circuit board composite according to the invention that is produced in particular by means of the above-described method comprises at least two printed circuit boards connected to one another in a form-fitting manner. Here, the second printed circuit board ensures support for the first printed circuit board, in particular for subsequent processing processes and/or a use of the printed circuit board composite in a device, for example in a control device of a vehicle, for example in a transmission control device.

The printed circuit board composite expediently comprises three interconnected printed circuit boards, preferably the first printed circuit board formed as sensor carrier printed circuit board, for the support thereof the second printed circuit board formed as supporting printed circuit board, and the third printed circuit board formed as main printed circuit board.

The first and second printed circuit board are connected to one another in a form-fitting manner, in particular via the two-groove plug connection, and can additionally be connected in a force-fitting and/or integrally bonded manner, the plastic overmolding providing the integrally bonded connection, for example. The third printed circuit board is connected to the first and/or second printed circuit board in a form-fitting, force-fitting and/or integrally bonded manner, for example by soldering, by plastic overmolding and/or by insertion and for example clamping of one or more positioning formations in a respective corresponding cutout.

The first printed circuit board is oriented substantially perpendicularly to the third printed circuit board. Consequently, if the component on the first printed circuit board is formed as a sensor, there is achieved a sensor dome by means of which the sensor is spaced apart from the third printed circuit board formed expediently as main printed circuit board.

BRIEF DESCRIPTION OF THE SEVERAL VIEWS OF THE DRAWING

Exemplary embodiments of the invention are explained in more detail below with reference to drawings.

In the drawings.

In all of the figures, the same reference signs are used for mutually corresponding parts.

DESCRIPTION OF THE INVENTION

Figure 1:
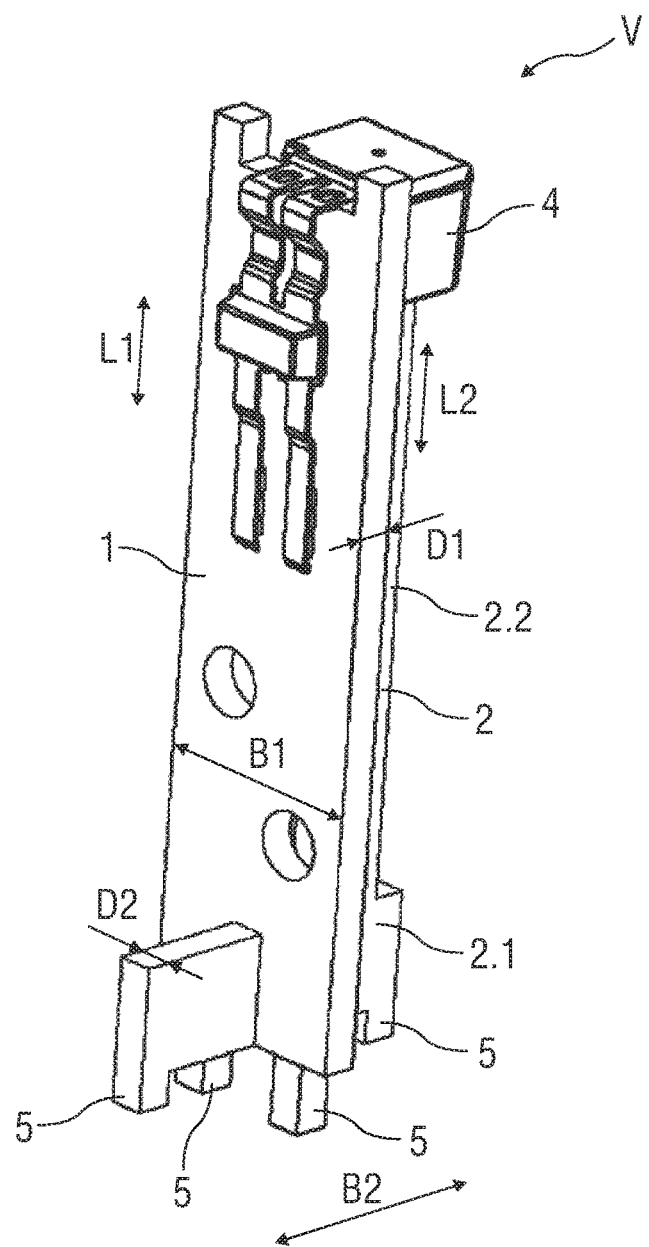
FIG. 1 schematically shows a perspective illustration of one embodiment of a printed circuit board composite composed of two printed circuit boards, FIG. 2 schematically shows a further perspective illustration of the embodiment of the printed circuit board composite from FIG. 1, FIG. 3 schematically shows a mounting operation of the printed circuit board composite from FIGS. 1 and 2, FIG. 4 schematically shows a perspective illustration of a printed circuit board composite composed of three printed circuit boards, FIG. 5 schematically shows a perspective illustration of a further embodiment of a printed circuit board composite composed of two printed circuit boards, FIG. 6 schematically shows a perspective illustration of a further embodiment of a printed circuit board composite composed of two printed circuit boards, and FIG. 7 schematically shows a further perspective illustration of the embodiment of the printed circuit board composite from FIG. 6.
Figure 2:
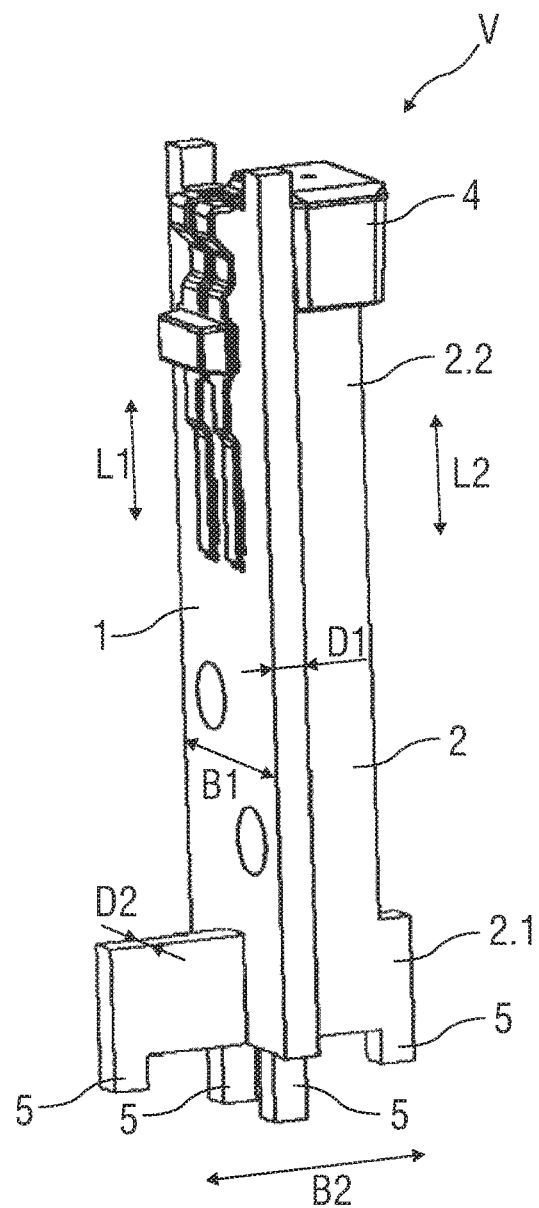

FIGS. 1 and 2 and 5 to 7 shows schematic illustrations of a printed circuit board composite V composed of two printed circuit boards 1, 2 connected to one another at least in a form-fitting manner. Here, the first printed circuit board 1 bears at least one component 4, in particular an electronic component 4. In the example illustrated, this component 4 is formed as a sensor, and therefore this first printed circuit board 1 is formed as a sensor carrier printed circuit board.

The second printed circuit board 2 is formed as a supporting printed circuit board whose function is to support the first printed circuit board 1, in particular during a below-described connection process for connecting at least the first printed circuit board 1 to a third printed circuit board 3 illustrated in FIG. 4, for example a main printed circuit board, to form the printed circuit board composite V which then comprises these three printed circuit boards 1, 2, 3. This connection process, during which the second printed circuit board 2 supports the first printed circuit board 1 so as to particularly ensure that the first printed circuit board 1 does not change its position relative to third printed circuit board 3, comprises, for example, a mounting process, a soldering process and/or a plastic overmolding process, in particular with a thermoset plastic.

In addition to this supporting function, it is also possible, for example, for the second printed circuit board 2 to bear one or more components 4, in particular electronic components 4 and/or electrical conductor tracks, in the same way as the first printed circuit board 1.

The printed circuit board composite V can be used, for example, in a vehicle, for example in a control device of the vehicle, for example in a transmission control device. However, other use possibilities are also conceivable, in particular in electrical or electronic devices which have a plurality of interconnected printed circuit boards.

Figure 4:
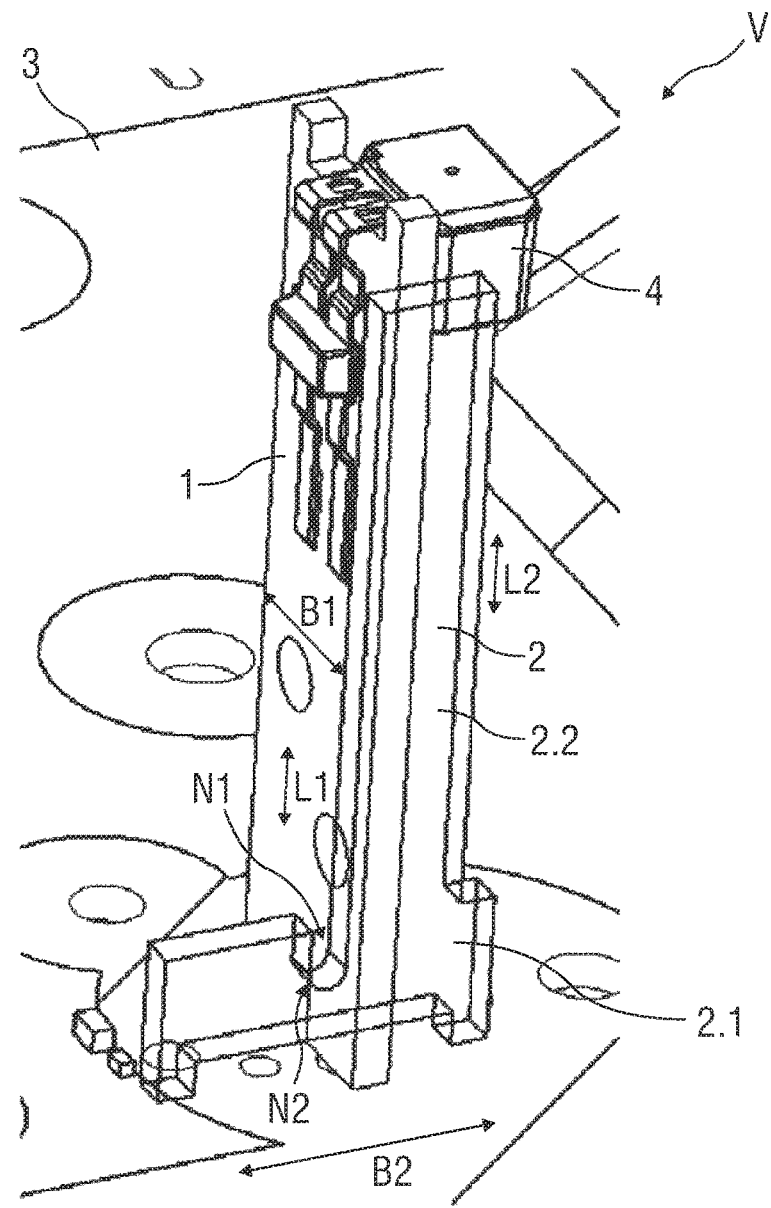

In a method for producing the printed circuit board composite V which comprises at least the first printed circuit board 1 and the second printed circuit board 2 and expediently furthermore also comprises the third printed circuit board 3, as shown in FIG. 4, the first printed circuit board 1 and the second printed circuit board 2 are connected to one another at least in a form-fitting manner. This advantageously occurs via a so-called two-groove plug connection.

Figure 3:
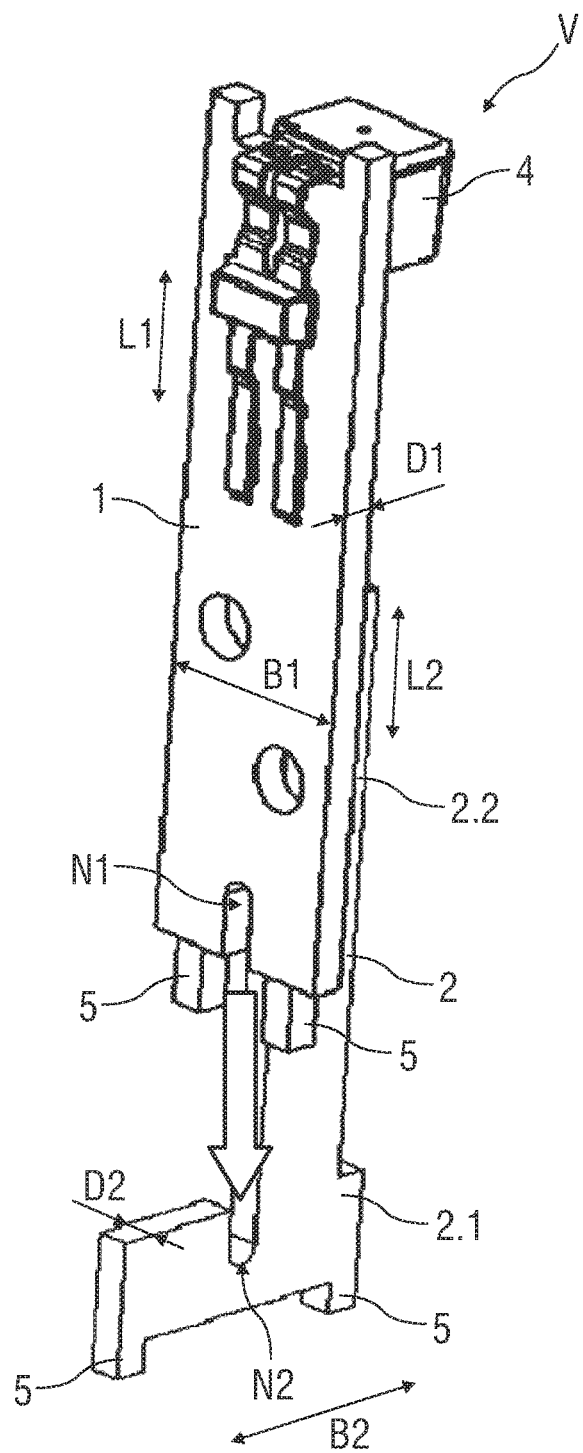

In order to allow this, the first printed circuit board 1 and the second printed circuit board 2 each have at least one groove N1, N2. The first printed circuit board 1 and the second printed circuit board 2 are, as shown in FIG. 3, connected to one another in such a way that groove bottoms of the two grooves N1, N2 contact one another. The connection of the first printed circuit board 1 and second printed circuit board 2 is shown in FIG. 3 using the example of the first printed circuit board 1 and second printed circuit board 2 illustrated in FIGS. 1 and 2. The connection of the embodiments, illustrated in FIGS. 5 to 7, of the first and second printed circuit board 1, 2 occurs substantially in the same way.

The first printed circuit board 1 and the second printed circuit board 2 are of plate-shaped design and therefore each have two mutually opposite flat sides, two longitudinal sides and two transverse sides. The longitudinal sides and transverse sides substantially form a peripheral lateral edge of the respective printed circuit board 1, 2. The first printed circuit board 1 and the second printed circuit board 2 are of substantially elongate design, that is to say they each have a length extent L1, L2, a width extent B1, B2 and a thickness extent D1, D2, wherein the length extent L1, L2 is greater, in particular substantially greater, than the width extent B1, B2, and wherein the width extent B1, B2 is greater, in particular substantially greater, than the thickness extent D1, D2. Corresponding to the longitudinal extent L1, L2 and width extent B1, B2, the longitudinal sides are longer than the transverse sides of the respective printed circuit board 1, 2. Length extent L1, L2 is to be understood as meaning an extent of the respective printed circuit board 1, 2 in its longitudinal direction. Width extent B1, B2 is to be understood as meaning an extent of the respective printed circuit board 1, 2 in its transverse direction, that is to say width direction. Thickness extent D1, D2 is to be understood as meaning an extent of the respective printed circuit board 1, 2 in its thickness direction.

The respective groove N1, N2 is formed as a depression in the respective lateral edge. A groove depth direction thus extends from an upper groove edge, that is to say from a groove opening, to the groove bottom of the respective groove N1, N2. A groove progression direction of the respective groove N1, N2 extends at a right angle to the groove depth direction and thus from one flat side to the opposite flat side of the respective printed circuit board 1, 2.

The groove N1 in the first printed circuit board 1 is formed in the region of one of the transverse sides, with the groove depth direction extending in the direction of the other transverse side, that is to say in the direction of the length extent L1 of the first printed circuit board 1. In particular, the groove N1 is formed in the region of the transverse side which faces away from the component 4 arranged on the first printed circuit board 1. This transverse side in which the groove N1 is formed is provided for connection with the third printed circuit board 3. In the illustrated exemplary embodiments according to FIGS. 1 to 7, it therefore has, on both sides of the groove N1, a respective positioning formation 5, also referred to as positioning pin, in the length extent L1 of the first printed circuit board 1 that, for mounting the first printed circuit board 1 with the third printed circuit board 3, is introduced into a respective corresponding cutout, for example a receiving hole, in the third printed circuit board 3.

In the exemplary embodiments according to FIGS. 1 to 4 and 6 and 7, the second printed circuit board 2 has a wide region 2.1 and an adjoining narrow region 2.2, wherein a width extent B2 of the wide region 2.1 is greater than a width extent B2 of the narrow region 2.2. The wide region 2.1 extends as far as a transverse side of the second printed circuit board 2 that is provided for connection with the third printed circuit board 3. It therefore expediently likewise has two positioning formations 5, also referred to as positioning pins, in the length extent L2 of the second printed circuit board 2 that, for mounting the second printed circuit board 2 with the third printed circuit board 3, are introduced into a respective corresponding cutout, for example receiving hole, in the third printed circuit board 3. Alternatively, instead of the positioning formations 5, there can be provided supporting feet which are placed onto a flat side of the third printed circuit board 3.

The groove N2 is formed in the second printed circuit board 2 in an edge side of the wide region 2.1 that faces the transverse side of the second printed circuit board 2 that is assigned to the narrow region 2.2. The groove depth direction extends here in the direction of the length extent L2 of the second printed circuit board 2, with the groove bottom being arranged closer to the transverse side assigned to the wide region 2.1, and the groove edge accordingly being arranged closer to the transverse side assigned to the narrow region 2.2. One of the groove walls is here formed as a continuation of a longitudinal edge region of the narrow region 2.2 into the wide region 2.1.

If the first printed circuit board 1 and the second printed circuit board 2 are connected to one another via the two-groove plug connection in the manner shown in FIG. 3, groove side walls of the groove N1 in the first printed circuit board 1 bear against in each case a flat side of the second printed circuit board 2, and groove side walls of the groove N2 in the second printed circuit board 2 bear against in each case a flat side of the first printed circuit board 1, with the result that the printed circuit boards 1, 2 are expediently clamped to one another via the grooves N1, N2. In addition, the narrow region 2.2 of the second printed circuit board 2 bears over a substantial part of the length extent L1 of the first printed circuit board 1, in particular over more than half the length extent L1 of the first printed circuit board 1, against one flat side of the first printed circuit board 1 and thus particularly supports the first printed circuit board 1 against tilting.

The first printed circuit board 1 and the second printed circuit board 1 are thus connected to one another in such a way or are connected to one another in the finished printed circuit board composite V in such a way that flat sides of the first printed circuit board 1 are oriented at right angles to flat sides of the second printed circuit board 2, that is to say surface normals of the first and second printed circuit board 1, 2 are oriented at right angles to one another. Here, the length extents L1, L2, in particular the respective direction thereof, of the two printed circuit boards 1, 2 are oriented parallel to one another. Here, the groove progression directions of the two grooves N1, N2 are oriented at right angles to one another, and the groove depth directions of the two grooves N1, N2 are oriented parallel to one another.

By correspondingly forming the second printed circuit board 2, it is additionally made possible for at least one component 4, in particular the sensor, on the first printed circuit board 1 to be supported by the second printed circuit board 2 in order thereby to obtain improved positioning accuracy of this component 4. In the exemplary embodiments according to FIGS. 1 to 4, this is achieved in that the length extent L2 of the second printed circuit board 2 is formed in such a way that the second printed circuit board 2, in the state in which it is joined together with the first printed circuit board 1, extends up to the component 4, which is to be supported, on the first printed circuit board 1, that is to say bears against the component 4 to be supported. In the exemplary embodiments according to FIGS. 6 and 7, this is achieved in that the second printed circuit board 2 is formed in such a way that, in the state in which it is joined together with the first printed circuit board 1, it encloses the component 4 to be supported at least in certain regions. In other words, the second printed circuit board 2 has a component cutout 6 which corresponds to a component shape of the component 4 to be supported and in which the component 4 to be supported is arranged after joining together the first and second printed circuit board 1, 2 and is thereby supported by the second printed circuit board 2 in a plurality of directions, in particular from above and below, that is to say in the length extent direction of the first printed circuit board 1. This particularly allows positional securement of the component 4, for example the sensor, in the plastic overmolding process. For example, the second printed circuit board 2 has a latching lug 7 by which it latches on the component 4.

It is also possible, in the manner described, for a plurality of components 4 on the first printed circuit board 1 to be supported by means of the second printed circuit board 2, with corresponding formation of the second printed circuit board 2.

It is possible by a correspondingly adapted shaping of the second printed circuit board 2 to provide a support for differently formed components 4, for example for different sensor structure designs. For this purpose, the shaping of the second printed circuit board 2 is to be adapted to the formation of the respective component 4.

Figure 5:
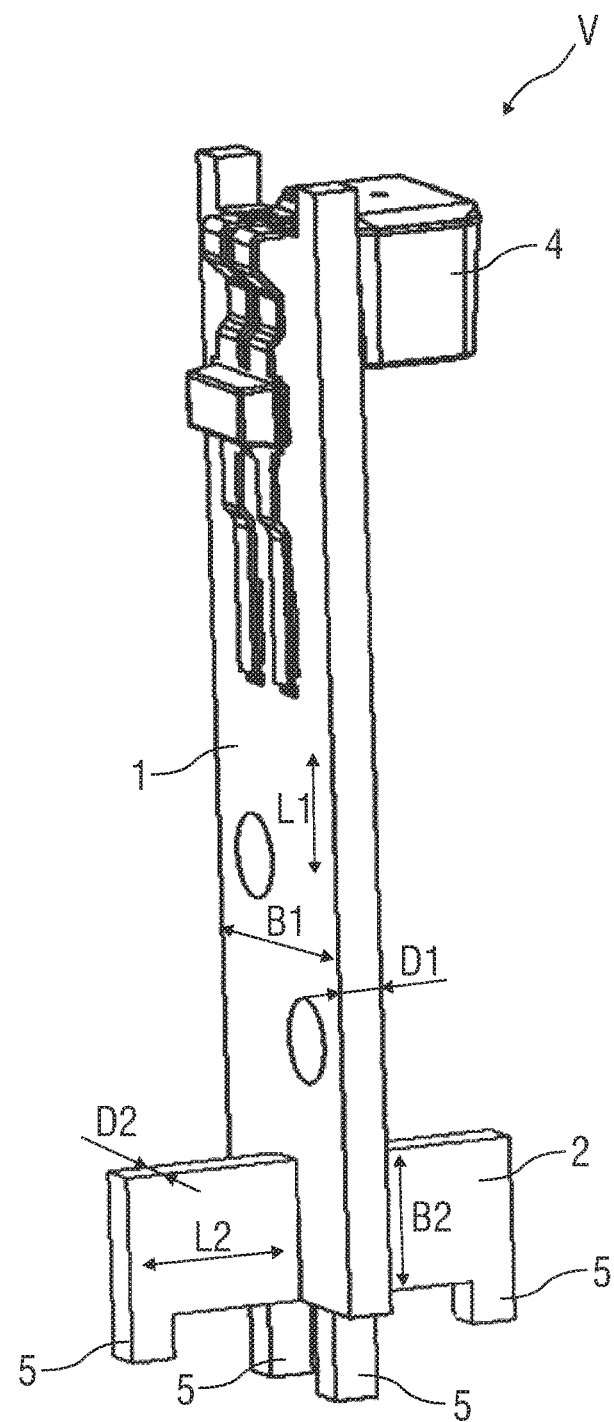
Figure 6:
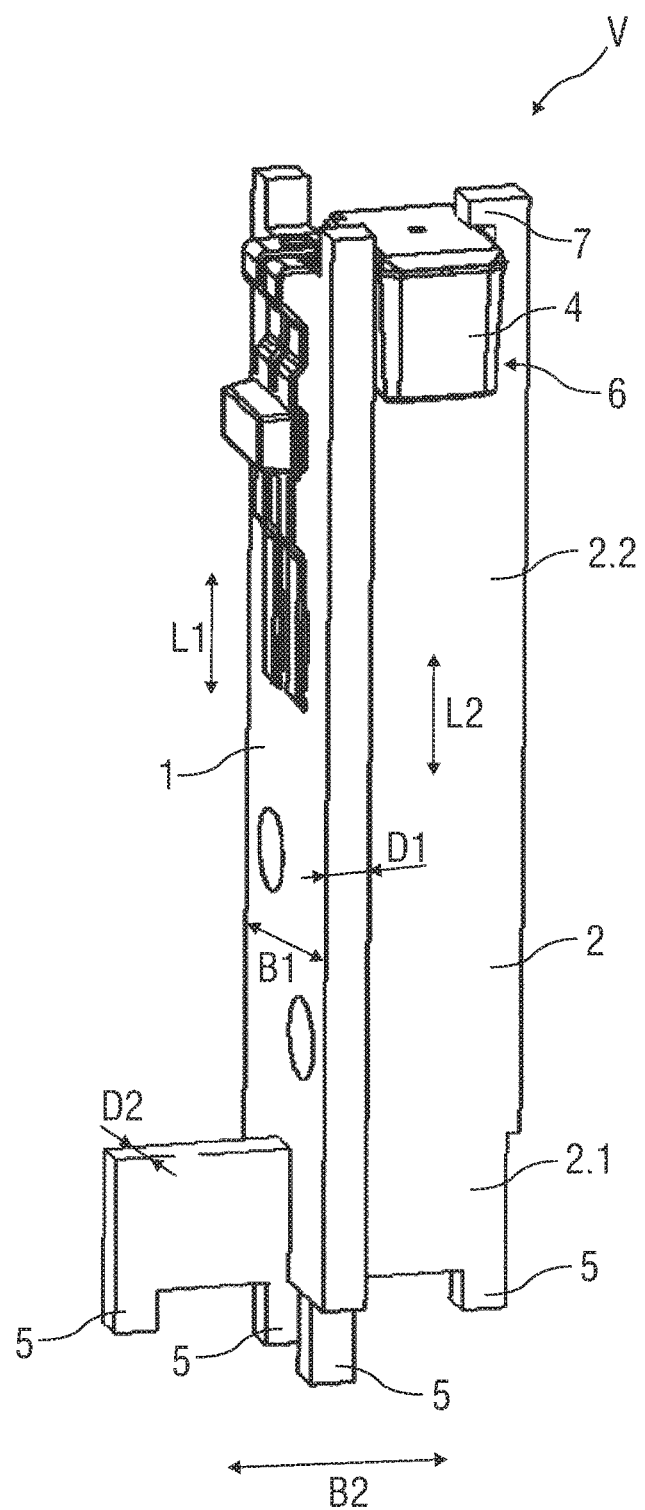

In the exemplary embodiment according FIG. 5, the first printed circuit board 1 is formed in the manner as has already been described above in relation to FIGS. 1 to 4 and 6 and 7. However, the second printed circuit board 2 is substantially shorter; it comprises substantially only the wide region 2.1 of the second printed circuit board 2 according to the other exemplary embodiments.

Therefore, the groove N2 is here formed in the region of one longitudinal side, with the groove depth direction extending in the direction of the other longitudinal side, that is to say in the direction of the width extent B2 of the second printed circuit board 2. Here, the groove N2 is formed in the region of the longitudinal side which is not provided for connection with the third printed circuit board 3. In this embodiment of the second printed circuit board 2, the other longitudinal side which is designed for connection with the third printed circuit board 3 has the two positioning formations 5 or feet in the width extent B2 of the second printed circuit board 2.

To mount the printed circuit board composite V, which expediently comprises the first, second and third printed circuit board 1, 2, 3, the first and second printed circuit board 1, 2 are thus advantageously connected to one another via the two-groove plug connection, as shown in FIG. 3, and then the first and second printed circuit board 1, 2 are connected to the third printed circuit board 3, as shown in FIG. 4. Here, the first printed circuit board 1 is held in position on the third printed circuit board 3 via its positioning formations 5, that is to say the positioning pins, expediently in the region of soldering points on the third printed circuit board 3. This positioning occurs here by clamping the positioning formations 5 in the respective corresponding cutout in the third printed circuit board 3. Alternatively, the second printed circuit board 2 can also first be arranged on the third printed circuit board 3 and then the first printed circuit board 1 can be inserted in the manner described into the second printed circuit board 2 and, if present, by its respective positioning formation 5 into the respective corresponding cutout in the third printed circuit board 3.

This expediently also applies to the second printed circuit board 2 and its positioning formations 5, if they are present. The positioning formations 5 of the first and/or second printed circuit board 1, 2 can be metal-coated at least in certain regions, advantageously all around, and be soldered, expediently without electrical contact, into the third printed circuit board 3. This is referred to as the principle of blind contact soldering. This soldering of the first and/or second printed circuit board 1, 2 to the third printed circuit board 3 thus serves merely for positionally securing the first and/or second printed circuit board 1, 2 relative to the third printed circuit board 3.

As shown in FIG. 4, after this joining-together of the three printed circuit boards 1, 2, 3, the first printed circuit board 1 is arranged perpendicularly to the second printed circuit board 3, with its length extent L1 extending parallel to a normal vector of the third printed circuit board 3, that is to say to the normal vector of the flat side of the third printed circuit board 3. As a result, the component 4, for example the sensor, on the first printed circuit board 1 is arranged spaced apart by means of the latter from the third printed circuit board.

The first printed circuit board 1, after being populated, that is to say after connection with the third printed circuit board 3 in the above-described manner and/or after population of the first and/or third printed circuit board 1, 3 with further components 4, is expediently received in a plastic overmolding mold, in particular in a thermoset overmolding mold. It is expediently held there in the plastic overmolding mold in the x direction, that is to say in the thickness extent direction, and in the y direction, that is to say in the width extent direction. The z direction, that is to say length extent direction, expediently remains free, that is to say that in this direction the first printed circuit board 1 does not bear against an inner side of the plastic overmolding mold in order that no compression forces act on the third printed circuit board 3 and on soldering points.

To complete the production of the printed circuit board composite V composed of first, second and third printed circuit board 1, 2, 3, the first printed circuit board 1 is then overmolded, at least in certain regions or completely, with a plastic, in particular with a thermoset plastic. Here, the second printed circuit board 2 is also expediently overmolded, in certain regions or completely, with the plastic, in particular thermoset, and/or at least regions of the third printed circuit board 3 are overmolded with the plastic, in particular thermoset.

If the component 4 on the first printed circuit board 1 is formed as a sensor, a so-called sensor dome is realized by this printed circuit board composite V. In the case of a sensor dome, the sensor is arranged so as to be spaced apart from the third printed circuit board 3, which is expediently formed as main printed circuit board, with the result that said sensor can project, for example, from a control device housing and project into another unit, for example into a transmission of a vehicle, or is arranged at least on a housing or in a housing cutout of the housing of the other unit.

Figure 7:
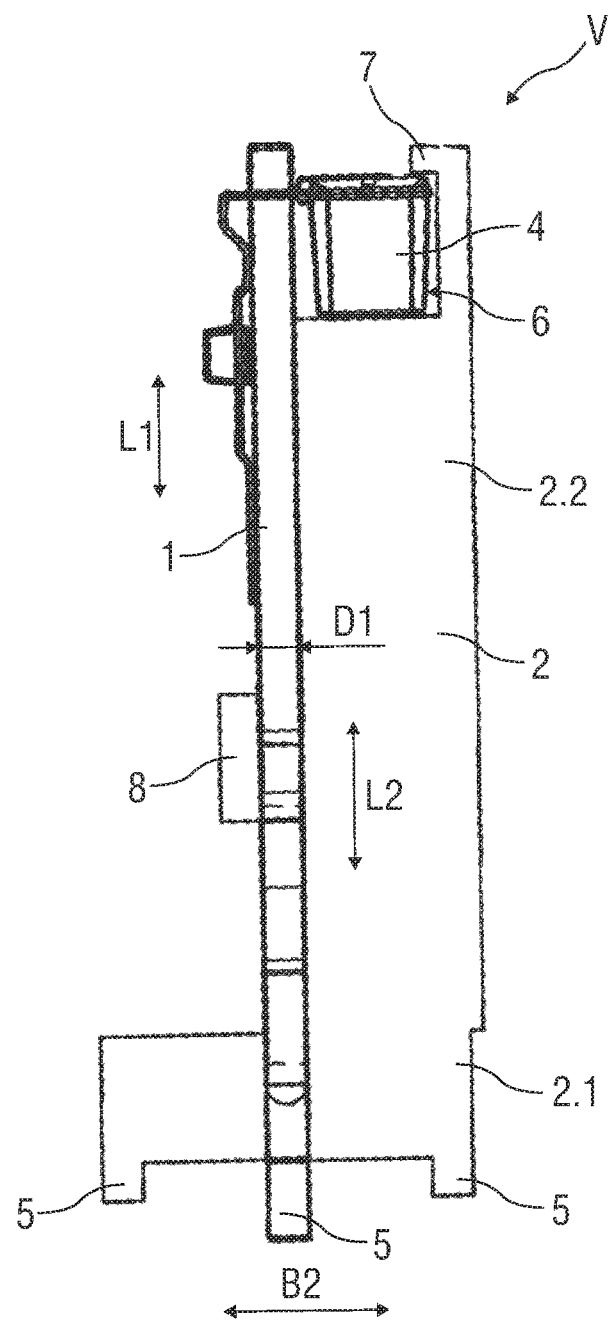

In order, particularly during plastic overmolding, to avoid the first and second printed circuit board 1, 2 drifting apart particularly in the region facing away from the third printed circuit board 3, there can be provision that the first printed circuit board 1 and the second printed circuit board 2 are latched with one another, as shown for example in FIG. 7. For this purpose, the first printed circuit board 1 and the second printed circuit board 2 expediently have one or more corresponding latching formations. For example, at least one latching opening is formed in one of the two printed circuit boards 1, 2, in the first printed circuit board 1 in FIG. 7, and a corresponding printed circuit board latching lug 8 is formed on the other printed circuit board 2, 1, on the second printed circuit board 2 in FIG. 7, said lug latching into the latching opening as a result of the two printed circuit boards 1, 2 being joined together. In other embodiments, corresponding latching hooks can be provided on the first and second printed circuit board 1, 2, said hooks being inserted into one another and latching into one another as a result of the first and second printed circuit board 1, 2 being joined together. This latching ensures a greater stability during the plastic overmolding and for example also during a use of the printed circuit board composite V.

In order to additionally improve position holding of the printed circuit boards 1, 2, 3 with respect to one another and/or of the at least one component 4 on the first printed circuit board 1 particularly in the plastic injection mold, it is additionally possible for so-called support geometries to be provided on one or more of the printed circuit boards 1, 2, 3, in particular on the first and/or second printed circuit board 1, 2 and/or in the plastic injection mold. That is to say corresponding supporting and/or holding formations.

The printed circuit board composite V produced in the manner described thus comprises, as shown in FIGS. 1 and 2 and 5 to 7, at least the first printed circuit board 1 and the second printed circuit board 2 which, in the manner described, in particular by two-groove plug connection, are connected at least in a form-fitting manner, for example additionally also in a force-fitting manner. The printed circuit board composite V produced in the manner described expediently comprises the first, second and third printed circuit board 1, 2, 3, at least the first printed circuit board 1 and the second printed circuit board 2 being connected in the manner described, in particular by two-groove plug connection, at least in a form-fitting manner, for example additionally also in a force-fitting manner.

The first and/or second printed circuit board 1, 2 are or is connected to the third printed circuit board 3, for example in a form-fitting, force-fitting and/or integrally bonded manner, being integrally bonded in particular by the plastic, in particular thermoset plastic, as a result of the above-described plastic overmolding, and/or for example by soldering. The form-fitting connection of the first and/or second printed circuit board 1, 2 with the third printed circuit board 3 is achieved, for example, by one or more positioning formations 5 introduced into respective cutouts of the third printed circuit board 3. The form fit between first and second printed circuit board 1, 2 can additionally result from the above-described latching.

The printed circuit board composite V can be used, for example, in a transmission control device for a vehicle or in another control device or in another electrical device. Particularly when used in the transmission control device, the first printed circuit board 1 is expediently formed as a sensor carrier printed circuit board and bears the sensor as component 4. The second printed circuit board 2 is formed as supporting printed circuit board, and the third printed circuit board 3 is formed as main printed circuit board. The arrangement of the first printed circuit board 1, supported by the second printed circuit board 2, on the third printed circuit board 3 results in the formation of a so-called sensor dome.

LIST OF REFERENCE SIGNS 1 first printed circuit board
2 second printed circuit board
2.1 wide region
2.2 narrow region
3 third printed circuit board
4 component
5 positioning formation
6 component cutout
7 latching lug
8 printed circuit board latching lug
B1, B2 width extent
D1, D2 thickness extent
L1, L2 length extent
N1, N2 groove
V printed circuit board composite

The invention claimed is:

1. A method for producing a printed circuit board composite, the method comprising:
connecting a first printed circuit board, being a sensor carrier printed circuit board, in a form-fitting connection to a second printed circuit board, being a supporting printed circuit board, wherein each of the first and second printed circuit boards have a groove with a groove bottom formed therein, and the first and second printed circuit boards are connected to one another such that the groove bottoms of the grooves fit in and contact one another; and
providing the first printed circuit board with a component and connecting the first and second printed circuit boards to one another such that the second printed circuit board contacts the component and supports the component in position.

2. The method according to claim 1, which comprises connecting the first and second printed circuit boards so as to be oriented with respect to one another with surface normals of the first and second printed circuit boards oriented perpendicular to one another.

3. The method according to claim 1, wherein the component is a sensor which, in an assembled state of the printed circuit board composite is supported in position by the second printed circuit board.

4. The method according to claim 1, which comprises latching the first and second printed circuit boards with one another.

5. The method according to claim 1, which comprises connecting at least the first printed circuit board to a third printed circuit board.

6. The method according to claim 5, which comprises introducing at least one positioning formation of the first printed circuit board into a corresponding cutout formed in the third printed circuit board and soldering the first printed circuit board and the third printed circuit board to one another.

7. The method according to claim 5, which comprises introducing at least one positioning formation of the first printed circuit board into a corresponding cutout formed in the third printed circuit board or soldering the first printed circuit board and the third printed circuit board to one another.

8. The method according to claim 1, which comprises overmolding at least the first printed circuit board with a plastic at least in certain regions thereof.

9. A printed circuit board composite, comprising:
first, second, and third printed circuit boards connected to one another in a form-fitting connection;
a sensor mounted to said first printed circuit board;
wherein said first and second printed circuit boards are disposed to project orthogonally from said third printed circuit board, said sensor is mounted distally from said third printed circuit board, and said printed circuit boards and said sensor are arranged to form a sensor dome;
wherein said first and second printed circuit boards are connected to one another such that the second printed circuit board contacts the sensor and supports the sensor in position; and
wherein each of said first and second printed circuit boards have a groove with a groove bottom formed therein, and said first and second printed circuit boards are connected to one another such that said groove bottoms of said grooves fit in and contact one another.

10. The printed circuit board composite according to claim 9, wherein said at least two printed circuit boards are three interconnected printed circuit boards.

11. A method for producing a printed circuit board composite, the method comprising;
connecting a first printed circuit board in a form-fitting connection with a second printed circuit board such that the second printed circuit board supports the first printed circuit board in position; wherein each of said first and second printed circuit boards have a groove with a groove bottom formed therein, and said first and second printed circuit boards are connected to one another such that said groove bottoms of said grooves fit in and contact one another and
commonly connecting said first and second printed circuit boards to a third printed circuit board in a form-fitting connection.

12. The method according to claim 11, which comprises providing the first printed circuit board with a component and connecting the first and second printed circuit boards to one another such that the component is supported in position by the second printed circuit board.

13. The method according to claim 11, wherein the first printed circuit board is a sensor carrier printed circuit board and the second printed circuit board is a supporting printed circuit board.

* * * * *